(12) United States Patent
Hong et al.

(10) Patent No.: US 6,917,011 B2
(45) Date of Patent: Jul. 12, 2005

(54) METHOD AND APPARATUS FOR DECAPPING INTEGRATED CIRCUIT PACKAGES

(75) Inventors: Ming Hui Hong, Singapore (SG); Yong Feng Lu, Singapore (SG); Wen Dong Song, Singapore (SG); Zhihong Mai, Singapore (SG); Kok Tong Thiam, Singapore (SG); Chye Eng Soh, Singapore (SG)

(73) Assignee: Advanced Micro Devices PTE Ltd., Singapore (SG)

( * ) Notice: Subject to any disclaimer, the term of this patent is extended or adjusted under 35 U.S.C. 154(b) by 250 days.

(21) Appl. No.: 10/193,773

(22) Filed: Jul. 10, 2002

(65) Prior Publication Data

US 2003/0010761 A1 Jan. 16, 2003

(30) Foreign Application Priority Data

Jul. 11, 2001 (SG) .......................................... 200104149

(51) Int. Cl.⁷ .............................................. B23K 26/00
(52) U.S. Cl. ............................ 219/121.69; 219/121.68
(58) Field of Search ...................... 219/121.69, 121.68, 219/121.67, 121.85, 121.6

(56) References Cited

U.S. PATENT DOCUMENTS

| | | | | |
|---|---|---|---|---|
| 5,350,713 A | * | 9/1994 | Liang | ........................ 438/106 |
| 5,367,762 A | * | 11/1994 | Disko et al. | .................. 29/764 |
| 5,961,860 A | * | 10/1999 | Lu et al. | ................ 219/121.65 |
| 6,335,208 B1 | * | 1/2002 | Lowry | ............................. 438/4 |
| 6,355,208 B1 | | 3/2002 | Unami et al. | .................. 419/11 |
| 6,518,074 B1 | * | 2/2003 | Nguyen et al. | ............... 438/14 |

FOREIGN PATENT DOCUMENTS

TW          451364          *    8/2001

OTHER PUBLICATIONS

Republic of China Patent Publication No. 451364.

* cited by examiner

*Primary Examiner*—M. Alexandra Elve
(74) *Attorney, Agent, or Firm*—Perman & Green, LLP (57) ABSTRACT

The invention relates to a method and apparatus for decapping integrated circuit packages. The invention involves irradiating an IC package with laser radiation, typically in the UV-IR spectra and of short pulse duration. The irradiation results in ablation of the molding compound. The invention also provides real-time monitoring and process control of the decapping process and fluid-flow removal of ablation debris. Using the invention, decapping can be performed without causing damage to the internal IC structure. Furthermore, decapping in a liquid can prevent oxidization of the molding compound by ambient air.

18 Claims, 8 Drawing Sheets

METHOD AND APPARATUS FOR DECAPPING INTEGRATED CIRCUIT PACKAGES

The invention relates to the field of decapping integrated circuits (also known as decapsulating or unpacking), particularly in preparation for device failure analysis. In particular, the invention relates to a method and apparatus for decapping IC packages.

Integrated circuit (IC) packaging typically involves placing a small wafer die on a leadframe (commonly a copper leadframe). Tiny copper or gold lines are then soldered to the corresponding lead legs in the leadframe and bond pads on the wafer die so as to provide electrical connections. In order to protect the device from environmental factors such as heat and humidity, a thin transparent layer of epoxy materials is typically then bonded to the upper surface of the wafer die, completely covering the die. The assembly is then encapsulated using a molding compound (usually black), so as to provide an IC package.

An important area of study in the IC industry is that of IC package failure analysis, which is vital in helping manufacturers to understand and address the causes of device failure whereby to improve manufacturing yield and device reliability. There are many known techniques of device failure analysis. One technique is that of electric signal detection, diagnosis of the results of which can give some insights into the reasons for device failure. However, using this technique it is difficult to obtain enough information for complete analysis, particularly as circuits become more and more integrated. A more thorough method of device failure analysis involves unpacking the IC package by removing the black molding compounds covering the wafer die and epoxy layer. This is known as decapping or decapsulating an IC package.

One decapping technique widely used is that of chemical decapping. In chemical decapping, sulfuric and/or nitric acide are used, depending on the molding compound(s) to be removed. Chemical decapping can take several hours and can potentially damage bond pads, solder balls and copper traces in the organic die attachments, in addition to damaging the leadframe itself. It can therefore be complicated and difficult to achieve thorough decapping while avoiding such collateral damage.

There is therefore a requirement for a method of decapping integrated circuit packages which reduces collateral damage to the internal structure of the integrated circuit. There is a further requirement for a decapping method which is simple, rapid, precise and safe in operation. There is a still further requirement for apparatus for carrying out such a method. It is an object of the present invention to fulfil the above requirements.

According to the above object, the invention provides a method for decapping an integrated circuit package, the said package comprising one or more layers of electronic circuitry covered by one or more layers of capping material, characterised in that the method includes the step of irradiating the integrated circuit package with laser radiation so as to remove the said capping material.

Preferably, the method includes the step of selecting a selected location on the package to be irradiated before performing the irradiation step.

Advantageously, the method further includes the steps of monitoring the decapping process; determining whether decapping is complete at the said selected location; if the above determination is negative, continuing to irradiate the package and if the above determination is positive, determining whether all decapping is complete; if all decapping has been determined to be complete, stopping the decapping process, and if all decapping has not been determined to be complete, selecting a new location at which the laser energy is to be directed and continuing to irradiate the package. Further advantageously, the said determination as to whether decapping is complete at the said location involves the monitoring of acoustic and/or optical signals emanating from the decapping location.

Preferably, the method includes the steps of measuring the energy of the laser radiation; comparing the measured energy of the laser radiation with an expected value and adjusting the laser energy accordingly if the two values do not correspond.

Advantageously, a fluid, preferably a liquid (e.g. water or Isopropyl Alcohol solution), is caused to flow over the package. The package is preferably immersed in liquid during the decapping process. The fluid may alternatively be a gas, e.g. air.

According to another aspect, the invention may comprise a device suitable for carrying out the above method.

For a better understanding of the present invention and to show more clearly how it may be carried into effect reference will now be made, by way of example, to the accompanying drawings which show schematically various embodiments of the present invention. The figures are not to scale.

Figure 1A:
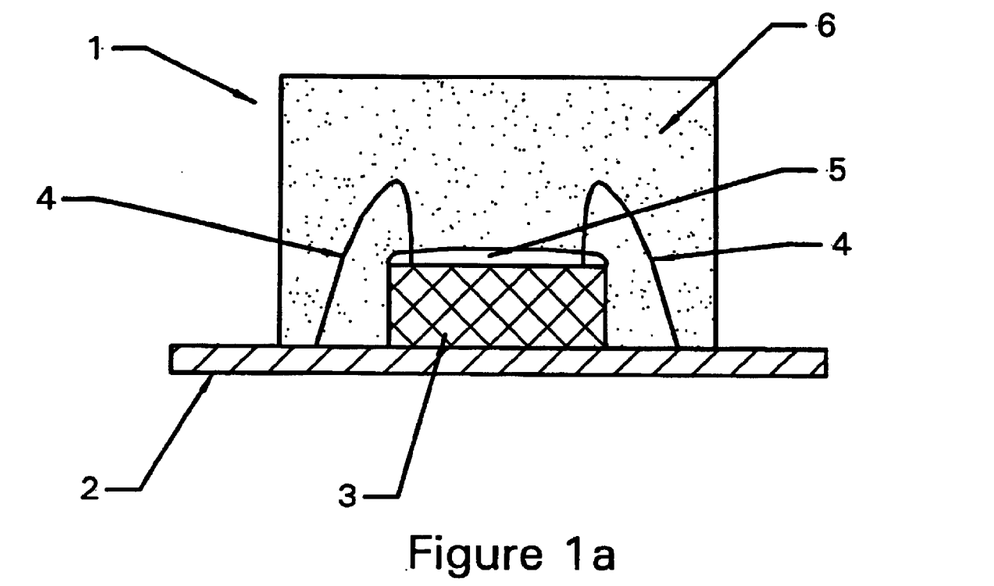
FIG. 1a is a diagrammatic representation of a cross-sectional slice through an IC package before decapping.
Figure 1B:
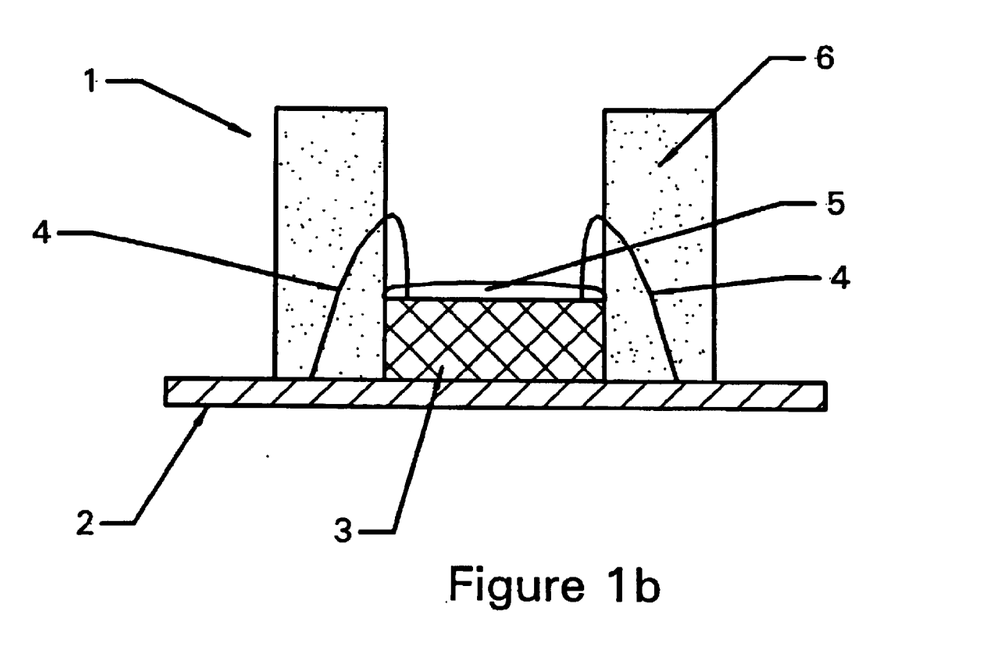
FIG. 1b is a corresponding representation after decapping.

FIGS. 1a and 1b show a cross-sectional slice through an IC package before and after decapping according to the invention. In FIG. 1a, an IC package (1) comprises a leadframe (2) upon which sits a wafer die (3). Wires, typically gold wires (4) form electrical connections between the leadframe (2) and wafer die (3). Covering the wafer die is a layer of transparent epoxy material (5). The wafer die and associated electrical connections are encapsulated by a layer of (usually black) molding material (6).

FIG. 1b shows the same view of the package after decapping. The layer of molding material (1) covering the wafer die (3) has been removed so that the upper surface of the wafer die (which bears electrical circuitry (not shown)) can be examined through the transparent epoxy layer (5). The connections between the wires (4) and wafer die (3) can also be examined. If more molding material is removed by further decapping, the connections between the wires (4) and leadframe (2) can also be examined.

Figure 2:
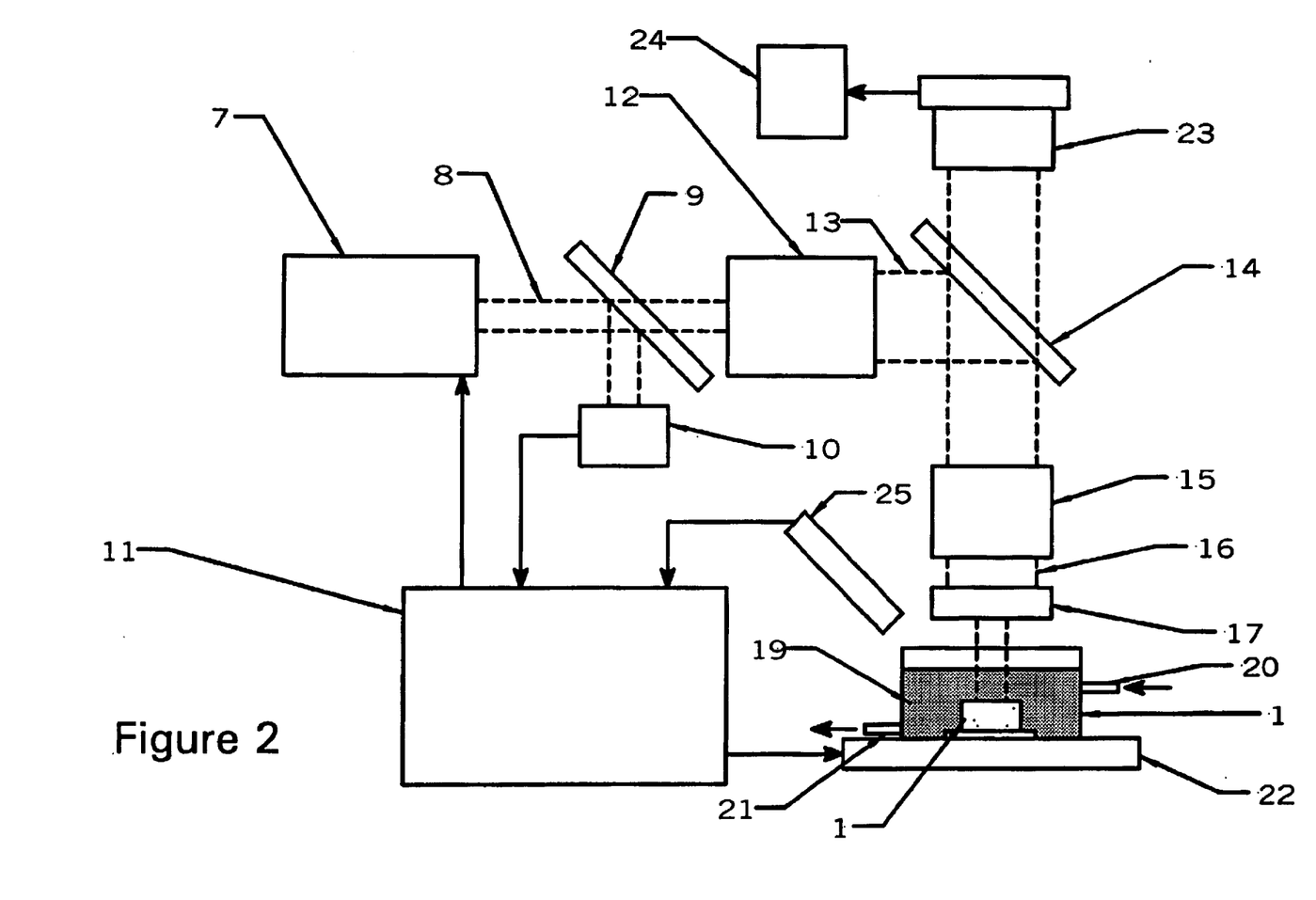
FIG. 2 is a schematic diagram showing an apparatus according to one aspect of the invention.

FIG. 2 shows apparatus suitable for carrying out the present invention. The figure shows a laser light source (7), preferably having a short pulse duration and wavelength in the UV to IR spectra. A suitable laser is for example a Nd:YAG laser having a pulse duration of 7 ns and a wavelength of 532 nm. The laser source (7) emits a beam (8), which then passes through a beam sampler (9). The beam sampler (9) passes a small percentage (e.g. 5%) of the beam to an energy meter (10), which monitors the laser pulse energy in real time. The reading of the meter (10) is sent to a process controller (11). The process controller compares the actual value with the expected value and if the two values do not coincide, adjusts the laser source output accordingly. The rest of the beam (8) passes to a beam expander (12) which produces an expanded beam (13). This expanded beam is reflected by a mirror (14) into a beam homogenizer (15) which produces a homogenized beam (16), which passes through an aperture (17) before being incident on the IC package (1). The homogenized beam provides a uniform energy profile on the package, the spot size of the beam on the package being controllable by the aperture (17).

The IC package (1) is held inside a decapping chamber (18). For laser decapping in a gas, e.g. air, the decapping chamber (18) is coupled with a gas stream or suction system to remove the ablation debris. In the system as shown, however, the decapping chamber contains a liquid (19) (e.g. water, Isopropyl Alcohol (IPA) solution or other suitable liquid) in which the package is immersed. The liquid prevents oxidation of the molding compound, thereby speeding up the process and necessitating a lower laser fluence. A liquid inlet (20) and outlet (21) are provided and a flow of liquid is maintained. Ablation debris is entrained in the flow of liquid and evacuated from the chamber via the liquid outlet (21). The accumulation of debris on the package surface is thereby avoided. The decapping chamber (18) is held on an X-Y stage (22), the movement of which is controlled by the process controller (10) in order to effect relative displacement of the laser and package surface so that the laser beam may be scanned over the package surface as desired. In an alternative configuration, the laser beam itself may be moved over the surface.

To monitor the laser decapping process in real time, a CCD camera (23) and associated monitor (24) are used to provide an image of the progress of the decapping process. Furthermore, during laser ablation of molding compounds, acoustic and optical signals are generated. The signal amplitude gives a measure of progress of the ablation process. An acoustic and/or optical monitoring device (25) may therefore be used in conjunction with the process controller (10) to monitor the ablation process in real time and to provide feedback control to the apparatus. Once it has been determined that decapping is complete at a particular location, the X-Y stage may be moved in order to perform decapping at a different location. The process is then repeated. Once it has been determined that the entire decapping process is completed, the process may then be terminated.

Figure 3:
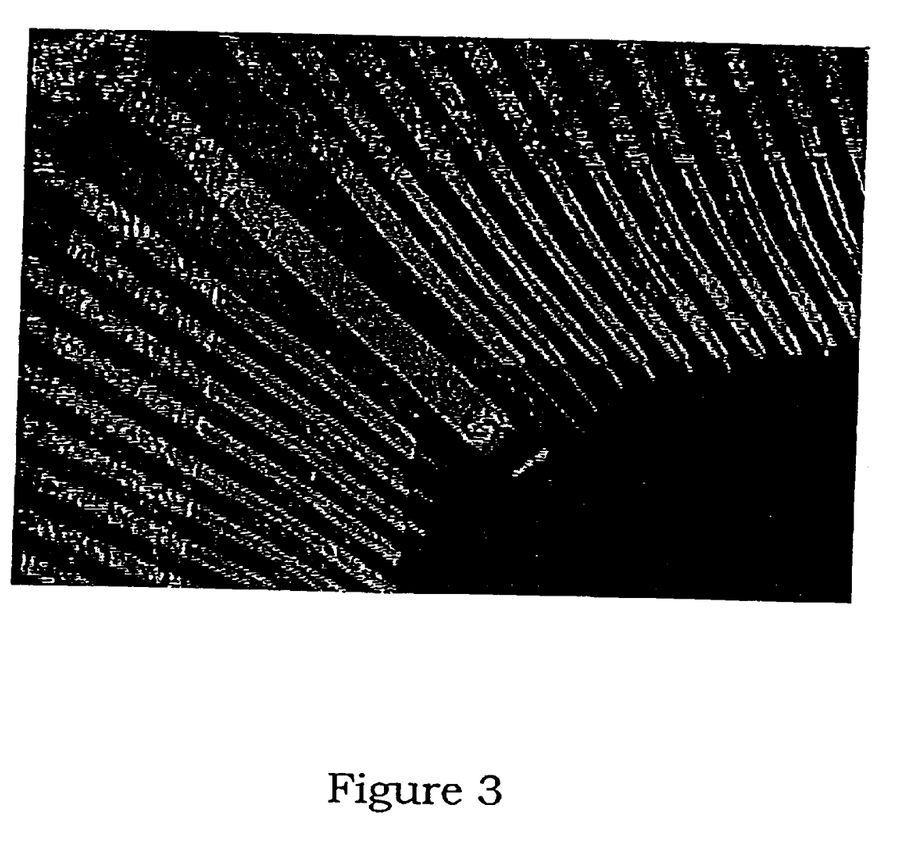
FIG. 3 is a microphotograph of the leadframe of an IC package which has been decapped according to the invention.
Figure 4:
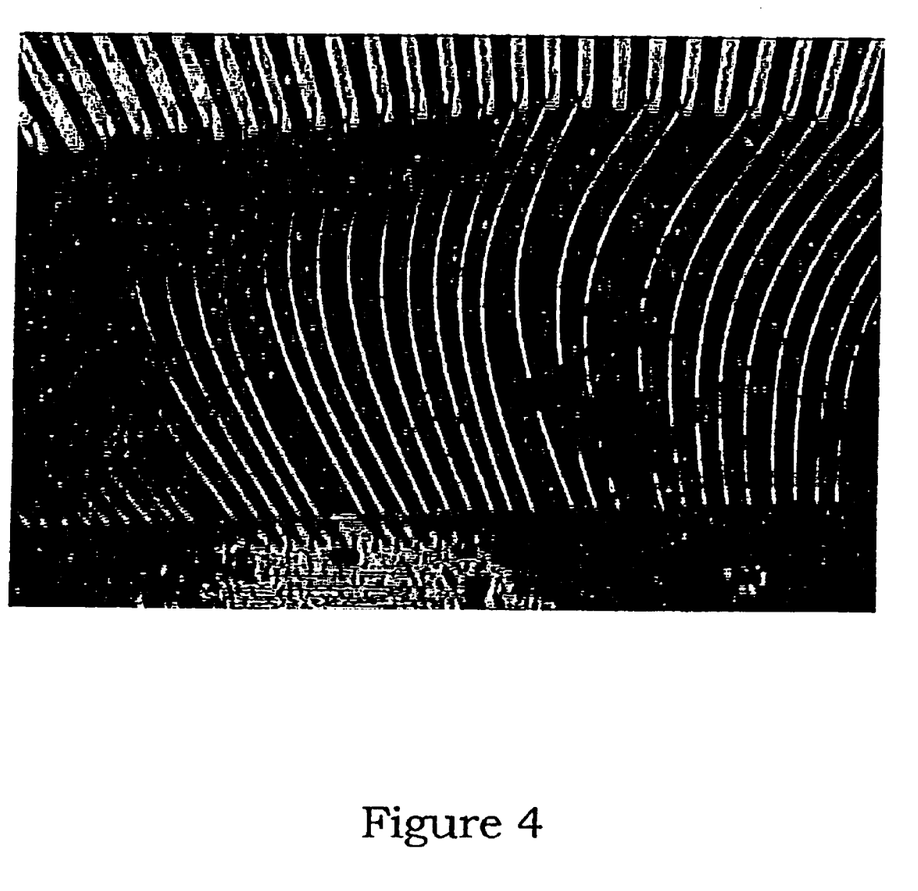
FIG. 4 is a microphotograph of the gold wires of an IC package which has been decapped according to the invention.
Figure 5:
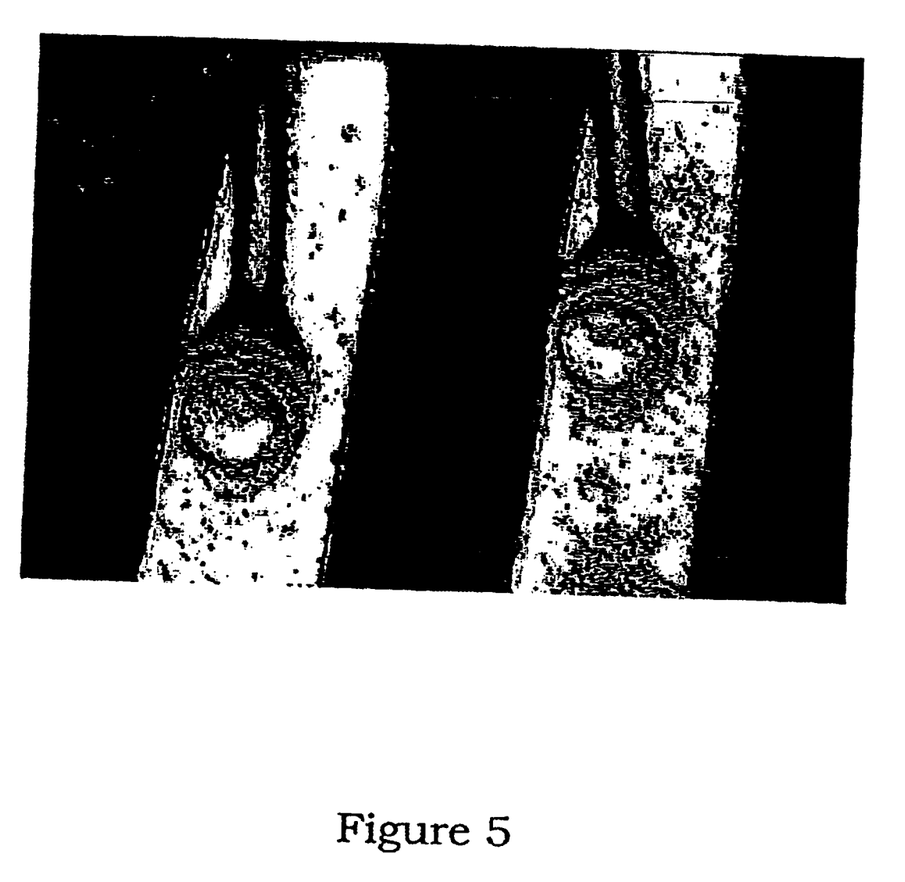
FIG. 5 is a microphotograph of the solder bonds to the leadframe of an IC package which has been decapped according to the invention.
Figure 6:
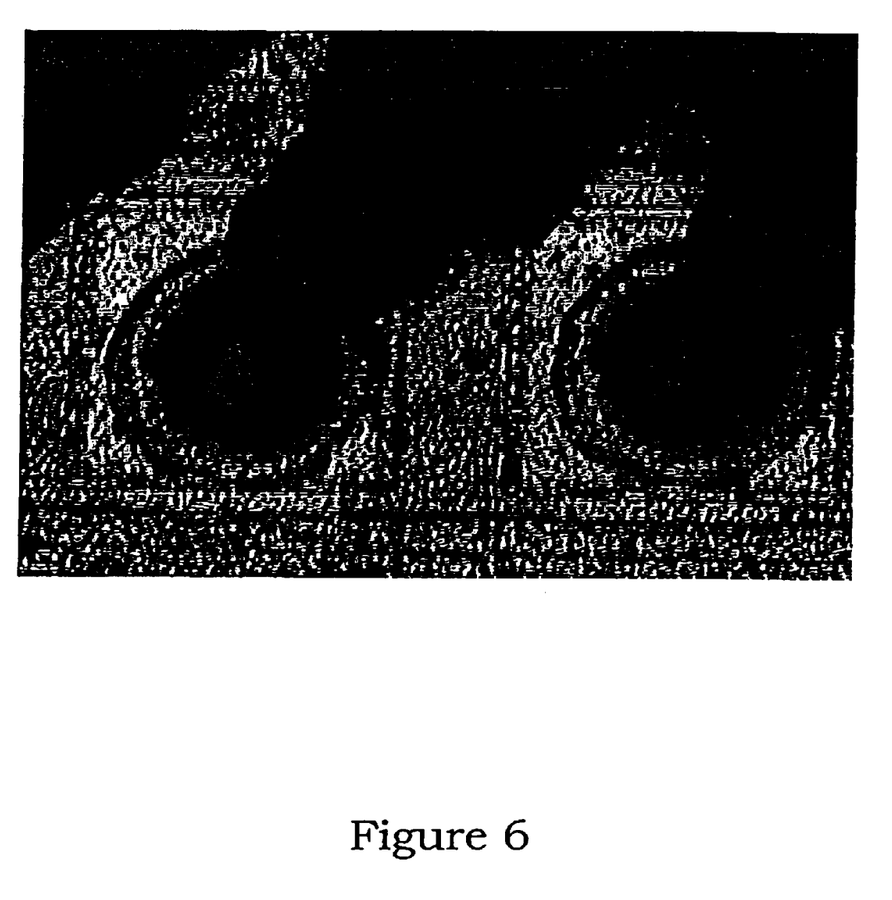
FIG. 6 is a microphotograph of the solder bonds to the bond pads of the wafer die of an IC package which has been decapped according to the invention.
Figure 7:
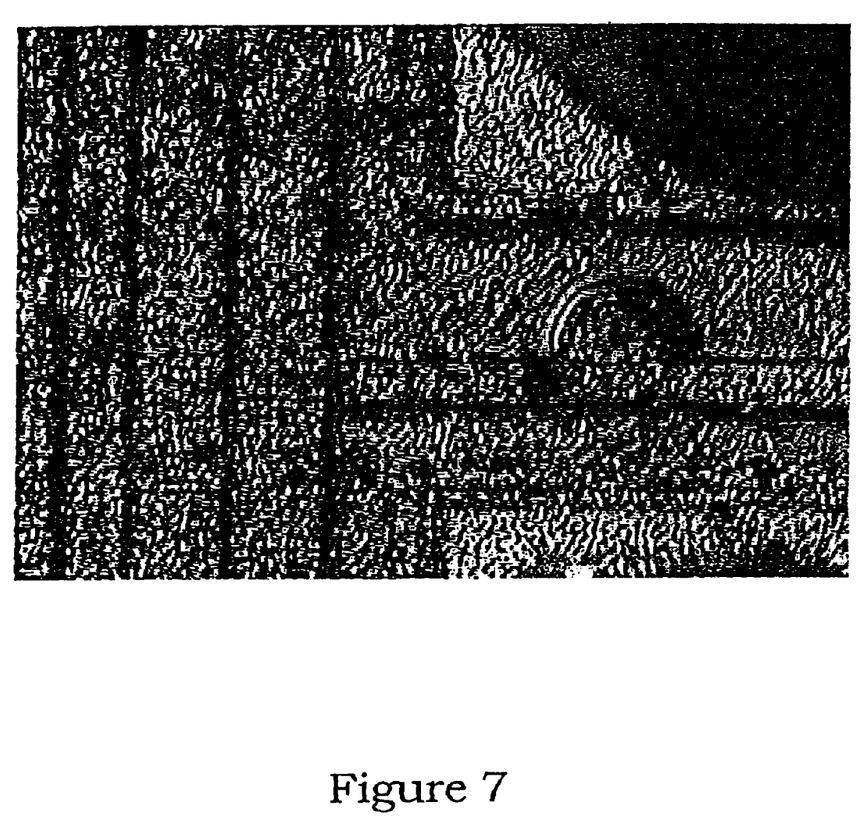
FIG. 7 is a microphotograph of the circuit configuration of the wafer die of an IC package which has been decapped according to the invention.

FIGS. 3–7 are microphotographs of various areas of a package which has been decapped according to the invention. FIG. 3 shows a decapped leadframe, FIG. 4 decapped wires, FIG. 5 shows decapped solder bonds to the leadframe, Figure 6 shows decapped bond pads of a wafer die and FIG. 7 shows the circuit configuration on a wafer die. As can be seen, decapping has been achieved without damaging the package structure.

Figure 8:
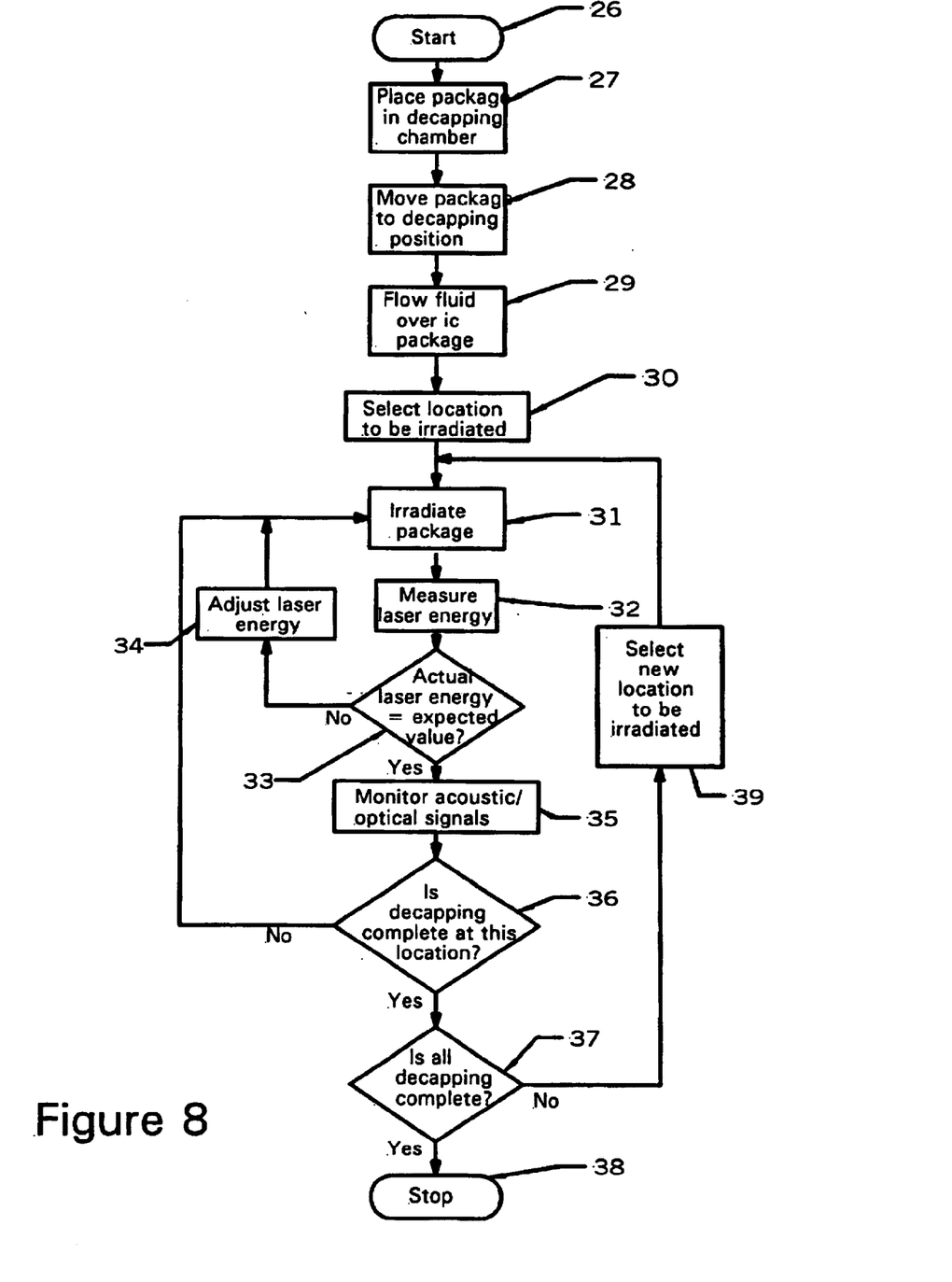
FIG. 8 is a flow diagram illustrating a method according to the invention.

FIG. 8 is a flowchart illustrating the method of the invention. At the start of the process (26), the package to be decapped is placed (27) in the decapping chamber. The package is moved (28) to its decapping position so as to be in the path of the laser beam. The flow of fluid over the package is initiated (29). The location to be irradiated is selected (30). The package is irradiated (31). The laser energy is measured (32) and it is determined (33) whether the actual value differs from the expected value. If so, the laser energy is adjusted (34). If the laser energy is as expected, the acoustic/optical signals emanating from the decapping region are monitored (35). If it is determined (36) from the results of this monitoring that decapping is incomplete at this location, irradiation continues (31). If decapping is complete at this location, a further determination is made as to whether or not all decapping is complete (37). If so, the process ends (38). If not, a new location to be irradiated is selected (39) and decapping continues (31) at a new location.

The method of the invention is a non-contact process, which allows the unpacking of the wafer die of an IC package for device failure analysis. Careful selection of laser processing parameters, such as pulse repetition rate, laser fluence, laser wavelength and pulse duration is required in order to achieve efficient and rapid laser decapping without compromising the internal IC package structure. No decapping chemicals are required and no chemical reactions take place on the epoxy layer, metal or semiconductor structures.

Molding compound is easily ablated using pulsed laser irradiation. Its ablation threshold fluence is much lower than those of metal/semiconductor materials. During laser ablation, tiny particles of molding compound debris are ejected from the surface at high speed. These particles can be removed using a fluid stream/suction system as discussed above. The fluid can be a gas, e.g. air, or a fluid, e.g. water or Isopropyl Alcohol (IPA) solution. Laser ablation is preferably carried out inside a liquid, the package being completely immersed. This will increase the ablation speed substantially as the oxidation of molding compounds due to ambient air can be prevented. Oxidation may also be prevented by performing the decapping in an inert atmosphere. The use of fluid immersion requires lower laser fluence.

In laser decapping, the laser fluence is a critical parameter. Too high a laser fluence, although increasing the processing speed, may result in damage to the epoxy layer, metal and/or semiconductor structures, especially at the interface with the molding compound. Since, as discussed, the ablation threshold of the molding compound is lower than that of the other materials, it is possible to select a value for the laser fluence which will not cause such collateral damage. The technique therefore has significant advantages over chemical decapping.

The invention relates to a method and apparatus for decapping integrated circuit packages. The invention involves irradiating an IC package with laser radiation, typically in the UV-IR spectra and of short pulse duration. The irradiation results in ablation of the molding compound. The invention also provides real-time monitoring and process control of the decapping process and fluid-flow removal of ablation debris. Using the invention, decapping can be performed without causing damage to the internal IC structure. Furthermore, decapping in a liquid can prevent oxidisation of the molding compound by ambient air.

What is claimed is:

1. A method for decapping an integrated circuit package (1), the package (1) comprising one or more layers of electronic circuitry covered by one or more layers of capping material (6), characterized in that the method includes the steps of immersing the integrated circuit package in liquid during the decapping process and irradiating the integrated circuit package (1) with laser radiation so as to remove the capping material (6).

2. A method according to claim 1 including the step of selecting (30) a selected location on the integrated circuit package to be irradiated before performing the irradiation step (31).

3. A method according to claim 2 wherein the method further includes the steps of monitoring (35) the decapping process; determining (36) whether decapping is complete at the said selected location; if the above determination is negative, continuing to irradiate (31) the integrated circuit package and if the above determination is positive, determining (37) whether all decapping is complete; if all decapping has been determined to be complete, stopping (38) the decapping process, and if all decapping has not been determined to be complete, selecting (39) a new location at which the laser energy is to be directed and continuing to irradiate (31) the integrated circuit package.

4. A method according to claim 3 wherein the said determination (36) as to whether decapping is complete at the said location involves the monitoring of acoustic and/or optical signals emanating from the decapping location.

5. A method according to claim 1 further characterized in that it includes the steps of (32) measuring the energy of the laser radiation; (33) comparing the measured energy of the laser radiation with an expected value and (34) adjusting the laser energy accordingly if the two values do not correspond.

6. A method according to claim 1 characterized in the further step (29) of causing a fluid (19) to flow over the integrated circuit package (1).

7. A method according to claim 6 wherein the said fluid (19) is a liquid.

8. A method according to claim 6 wherein the said fluid (19) is a gas.

9. The method of claim 1 wherein the liquid is water or Isopropyl alcohol.

10. The method of claim 1 further comprising, after immersing the integrated circuit package, initiating a flow of the liquid over the package to remove debris in the liquid flow.

11. A device for decapping an integrated circuit package, the integrated circuit package (1) comprising one or more layers of electronic circuitry covered by one or more layers of capping material characterized in that the device comprises a source (6) of laser energy and means (21) for holding the integrated circuit package; a source of liquid for immersing the integrated circuit package in the liquid (19) during the decapping process; the integrated circuit package being irradiated by the laser energy so as to remove the capping material.

12. A device according to claim 11 wherein means (9, 10, 11) are provided to monitor the said laser energy, compare the monitored value with an expected value and adjust the properties of the laser source (6) accordingly.

13. A device according to claim 11 wherein means (25, 11) are provided to monitor the laser decapping process.

14. A device according to claim 11 wherein means (23, 24) are provided to provide an image of the integrated circuit package during the laser decapping process.

15. A device according to claim 11 wherein means (20, 21) are provided to generate a flow of fluid (19) over the integrated circuit package during the decapping process.

16. A device according to claim 11 wherein means (22) are provided to effect relative movement between the laser energy directed at the integrated circuit package and the integrated circuit package itself, whereby different locations on the integrated circuit package may be irradiated.

17. The device of claim 11 wherein the fluid is water or Isopropyl alcohol.

18. The device of claim 11 further comprising a flow source for initiating a flow of the liquid over the integrated circuit package to remove debris from the integrated circuit package in the liquid flow.

* * * * *